US009691515B2

(12) United States Patent
Karlen et al.

(10) Patent No.: US 9,691,515 B2
(45) Date of Patent: Jun. 27, 2017

(54) BUS BAR ASSEMBLY COMPRISING A MEMORY METAL COMPOSITION

(71) Applicant: HAMILTON SUNDSTRAND CORPORATION, Charlotte, NC (US)

(72) Inventors: Eric Karlen, Rockford, IL (US); John Horowy, Rockford, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 509 days.

(21) Appl. No.: 14/162,332

(22) Filed: Jan. 23, 2014

(65) Prior Publication Data

US 2015/0098169 A1    Apr. 9, 2015

Related U.S. Application Data

(60) Provisional application No. 61/888,937, filed on Oct. 9, 2013.

(51) Int. Cl.
*H02G 5/00* (2006.01)
*H01B 1/02* (2006.01)
*H05K 7/20* (2006.01)

(52) U.S. Cl.
CPC ............. *H01B 1/026* (2013.01); *H01B 1/02* (2013.01); *H01B 1/023* (2013.01); *H05K 7/209* (2013.01);
(Continued)

(58) Field of Classification Search
CPC ... H02B 1/22; H02B 1/21; H02B 1/20; H02B 11/06; H02H 7/22; H01L 31/0201;
(Continued)

(56) References Cited

U.S. PATENT DOCUMENTS

2006/0164813 A1* 7/2006 Yoshioka .......... H01L 23/49844
361/717
2009/0200864 A1* 8/2009 Maier ................. B60R 16/0207
307/9.1
(Continued)

FOREIGN PATENT DOCUMENTS

CN    102 501 006    6/2012
CN    102 534 275    7/2012
(Continued)

OTHER PUBLICATIONS

Marple, William J., The Cold Gas-Dynamic Spray and Characterization of Microcrystalline and Nanocrystalline Copper Alloys, Dec. 2012, Naval Postgraduate School, p. 5.*
(Continued)

*Primary Examiner* — Jayprakash N Gandhi
*Assistant Examiner* — Stephen Sul
(74) *Attorney, Agent, or Firm* — Snell & Wilmer L.L.P.

(57) ABSTRACT

A power distribution system element formed via an additive manufacturing technique, such as applying a conductive material to a memory metal substrate, are discussed herein. In operation (e.g. in response to delivering current through the distribution system), the memory metal contracts while the conductive material expands. The result is distribution system element having reduced thermal expansion, which can be net zero coefficient of thermal expansion.

16 Claims, 4 Drawing Sheets

(52) U.S. Cl.
CPC .............. *H01L 2224/83101* (2013.01); *H05K 2201/10272* (2013.01)

(58) Field of Classification Search
CPC .... H01L 2224/831; H02G 5/00; H02G 5/005; H02G 5/002; H01R 25/14; H01B 17/18; H01B 1/026; H01B 1/023; H01B 1/02; H05K 7/209; H05K 2201/10272; H05K 1/0271; H05K 2201/068; C22C 14/00; H02M 7/003
USPC ....... 361/624, 107, 108, 611, 637, 639, 675, 361/728, 648, 775; 174/16.2, 68.2, 71 B, 174/88 B, 174, 70 B, 72 B, 99 B, 149 B, 174/129 B, 133 B
See application file for complete search history.

(56) References Cited

U.S. PATENT DOCUMENTS

2009/0311123 A1* 12/2009 Zhang ................... C22C 1/0491 419/19

2013/0127690 A1* 5/2013 Tsai ........................ G09F 9/301 345/55
2013/0171843 A1* 7/2013 Barnette ............ H01R 12/7088 439/70

FOREIGN PATENT DOCUMENTS

| | | | |
|---|---|---|---|
| CN | 102 832 377 | | 12/2012 |
| CN | 102501006 B | * | 7/2013 |
| CN | 102534275 B | * | 10/2013 |
| DE | 102010051669 | | 5/2012 |
| EP | 2 355 638 | | 8/2011 |
| GB | 2 311 414 | | 9/1997 |
| KR | 20080010086 A | * | 1/2008 |

OTHER PUBLICATIONS

Application No./Patent No. 14187911.4-1801 / 2860737; European Search Report dated Jul. 7, 2015; 8 pages.
communication Pursuant to Article 94(3) EPC dated Jan. 10, 2017 in European Application No. 14187911.4.

* cited by examiner

BUS BAR ASSEMBLY COMPRISING A MEMORY METAL COMPOSITION

CROSS-REFERENCE TO RELATED APPLICATIONS

This application is a nonprovisional of, and claims priority to, and the benefit of U.S. Application No. 61/888,937, entitled, "BUS BAR ASSEMBLY COMPRISING A MEMORY METAL COMPOSITION FIELD," filed on Oct. 9, 2013, which is hereby incorporated by reference in its entirety.

FIELD

The present disclosure relates to bus bars, and more particularly, to systems and methods of utilizing memory metal and/or additive manufacturing in bus bar assemblies.

BACKGROUND

In conventional electrical power distribution, a bus bar is a length of material or bar of copper, brass or aluminum that conducts electricity as part of a switchboard or other electrical apparatus. A bus bar may be an electrical conductor, configured to maintain a specific voltage and capable of carrying a high current, typically used to make a common connection between several circuits in a system. Solid state electronics may generate heat at die interfaces and attachment locations during operation. This heat may result in thermal expansion of components. The heat dissipated by a bus bar and its thermal expansion may be a limiting design factor and/or an important system design consideration.

SUMMARY

The present disclosure relates to a bus bar. The bus bar may be formed from a composition of materials. For instance, the bus bar may be formed by an additive manufacturing technique (e.g. cold spraying of particles of conductive material on a memory metal framework substrate). The bus bar, connection points, and various attributes may also be formed by ultrasonic additive manufacturing wherein the memory metal is embedded into a metal matrix created by the successive addition of metal foil. The composition of the memory metal and the electrically conductive material may have a substantially net zero coefficient of thermal expansion during operation of the bus bar (e.g., in response to current being delivered through the bus bar at normal operating levels).

The present disclosure relates to an electrical distribution system. The electrical distribution system may include a power source and a common connection between a plurality of components. The power source may be electrically coupled to the plurality of components via the common connection. The common connection may be formed by additive manufacturing an electrically conductive material onto a memory metal substrate framework.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration and their best mode. While these exemplary embodiments are described in sufficient detail to enable those skilled in the art to practice the disclosure, it should be understood that other embodiments may be realized and that logical changes may be made without departing from the spirit and scope of the disclosure. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step.

Removing heat from a device in a direct and efficient fashion is desirable. In order to circumvent traditional thermal expansion, conventionally, multiple layers of material are added to account for the thermal expansion of the electrical components and in particular the thermal expansion of a bus bar. Stated another way, in general, thermal interfaces are needed for each layer of a circuit board. Multiple thermal interfaces, such as thermal interfaces between bus work and a circuit board, may result in the part running at an elevated temperature during normal operation. This may result is a shortened lifespan of the circuit board. By removing these additional interfaces, a more efficient throughput of heat delivery to a cooling medium is achieved.

Electrical conductivity, thermal conductivity and mechanical strength are all power distribution design considerations. Matching and/or having within an acceptable range of thermal expansion of parts in a power distribution component may also be an important design consideration.

Traditionally, multi-interfaces between a silicon die and a conductive path exist. One of these interfaces is within the bus bar itself. One or more layers of solder, and potentially a layer of copper, and/or a layer of molybdenum may be part of a system. The thermal expansion properties of molybdenum closely match that of silicon. In response to the presence of heat, a cylindrical structure of molybdenum expands axially rather than radially. For instance, in the case of a stacked silicon die on top of a molybdenum plate, the molybdenum will expand within the plane of the plate rather than expand in a plane orthogonal to the plate. Thus, the management of the thermal expansion or the mismatch in thermal expansion between all these different components is managed through multiple layers. A bus bar with little to no thermal expansion allows for the removal of several of these interfaces. Applying conductive adhesives solders may elevate the temperatures of the devices and the entire assembly to an undesirable level.

Figure 1:
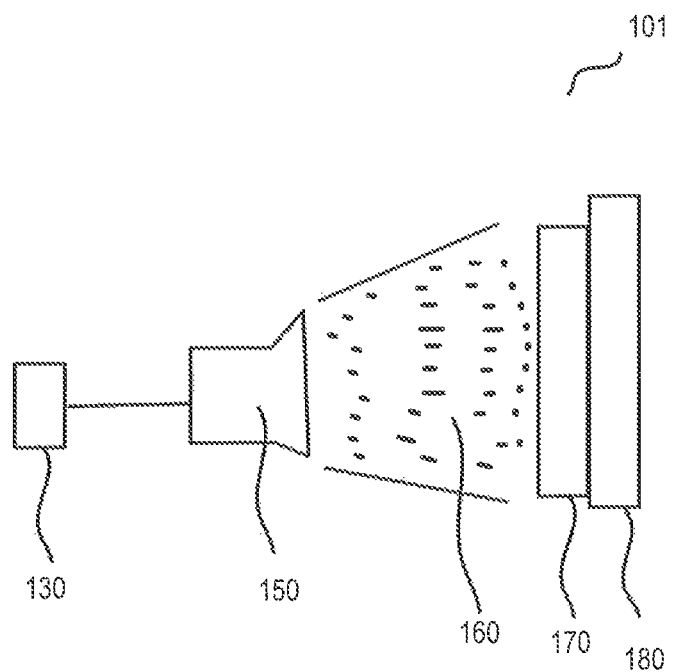
FIG. 1 is a representative block diagram of an additive manufacturing technique to form a common connection assembly, such as a bus bar, in accordance with various embodiments.
Figure 2:
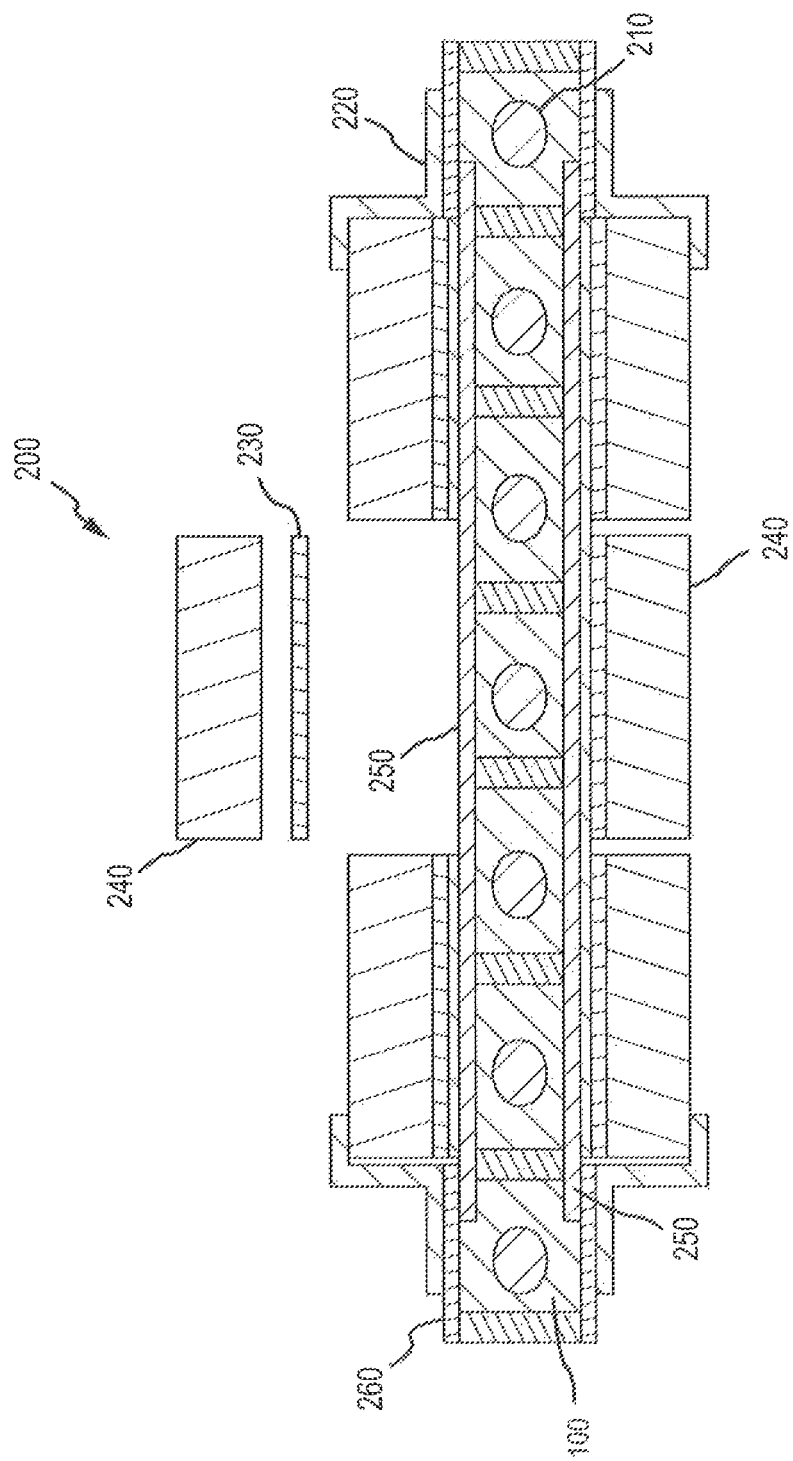
FIG. 2 is a representative bus bar in accordance with various embodiments.

In accordance with various embodiments and with reference to FIGS. 1 and 2, a bus bar 100 is disclosed. At least a portion of bus bar 100 is formed from a plurality of materials. For instance, a first portion of bus bar 100 may be formed from a traditional bus bar material, such as brass, nickel, silver, gold, zinc, iron, copper or aluminum. A second portion of bus bar 100 may be formed from a memory metal, shape alloy or smart metal. For instance, the memory metal may be a shape memory alloy, such as nitinol wire (nickel titanium alloy). Nitinol is a nickel-titanium alloy distinguished from other materials by its shape memory and super-elastic characteristics. Shape memory alloys are able to show an elastic deformation behavior. A super-elastic characteristic may be referred to as a mechanical shape memory effect or super elasticity. Super-elasticity is caused by the stress-induced phase transformation from a high temperature phase into a low temperature phase. The strain related to this phase transformation is fully reversible after removing the stress.

The first and second portions preferably overlap and/or form a merged structure. According to various embodiments, bus bar 100 may be formed from an aluminum matrix with nitinol wires embedded into this matrix. Bus bar 100 may be designed and/or scaled to carry any desired voltage or power.

For instance, nitinol wire, a shape memory alloy, may be embedded using additive manufacturing in an aluminum bus bar that has high temperature silicon dies coupled to a surface, such as its top surface. Solder pads, such as a copper solder pad and/or conductive traces may also be additively manufactured on a surface, such as a top surface, of the bus bar for die attach points. This layout may be configured to provide adequate solderability for a device coupled to a surface of the device. Direct write additive manufacturing technologies may be used to form the wire bonds from the silicon/silicon carbide die to the bus bar. An exothermic soldering process using an amorphous material (Nanofoil) clad on both sides with solder material may be used to bond a silicon/silicon carbide dies to the bus bar die attach points.

The additive manufacturing technique 101 may include ultrasonic consolidation (or ultrasonic additive manufacturing), cold spray and/or the like. For instance, the term "cold spray" as used herein may include a process by which particulates 160 are deposited by means of ballistic impingement upon a suitable substrate 180 at supersonic velocities to form a coating 170 or a free-standing structure. The ballistic impingement may be via a supersonic nozzle 150. The particles 160 may be fed by feeder system 130 which may toggle between various source material stocks. Also, pressure and heat may be provided by the feeder system 130. The melting of particles that occurs during most thermal spray processes can result in oxidation of both the coating and substrate materials. The resulting oxides decrease the adhesive and cohesive strengths of the coating. The cold spray process may avoid such reactions. Cold spay process may be highly precise if desired allowing for materials to be formed in particular patterns and orientations.

According to various embodiments and with reference to FIG. 2, a representative bus bar 100 assembly 200 is depicted. Nitinol wire 210 elements may be arranged in predetermined orientations, such as arranged along a common plane with spaces between the nitinol wire 210 to form substrate 180. Layers of material, such as aluminum, may be added, to substrate 180 such as through an additive manufacturing technique 101. Layers adding thickness may be added in any direction of bus bar 100. Copper 250, such as a portion or layer of copper 250 may be added to a top surface or bottom surface of bus bar 100. The layer of copper 250 may be formed through an additive manufacturing technique 101. Insulation 260 layers may be formed on bus bar 100 where desired. Insulation 260 may be made from any desired material. The insulation 260 is configured to electrically shield the interface between two or more components. Insulation 260 layers may be direct write insulation layers formed through the additive manufacturing technique 101 described above. Similarly, a bond wire 220 may be coupled to bus bar 100 via a direct write technique, such as through additive manufacturing technique 101. A mosfet die 240, such as silicon carbide die, may be bonded to the copper layer 250 via an exothermic soldering process. For instance, dies 240 prewet with solder may be combined with a nanofoil material to join the die 240 to bus bar 100 and/or a solder plated nanofoil 230 material may be positioned between the die 240 and the copper 250 layer. The solder plated nanofoil 230 may be ignited which propagates a reaction across its surface creating a bond between the die 240 and bus bar 100. The components 100, 240, realize very little heat through this exothermic soldering/bonding process.

Figure 3:
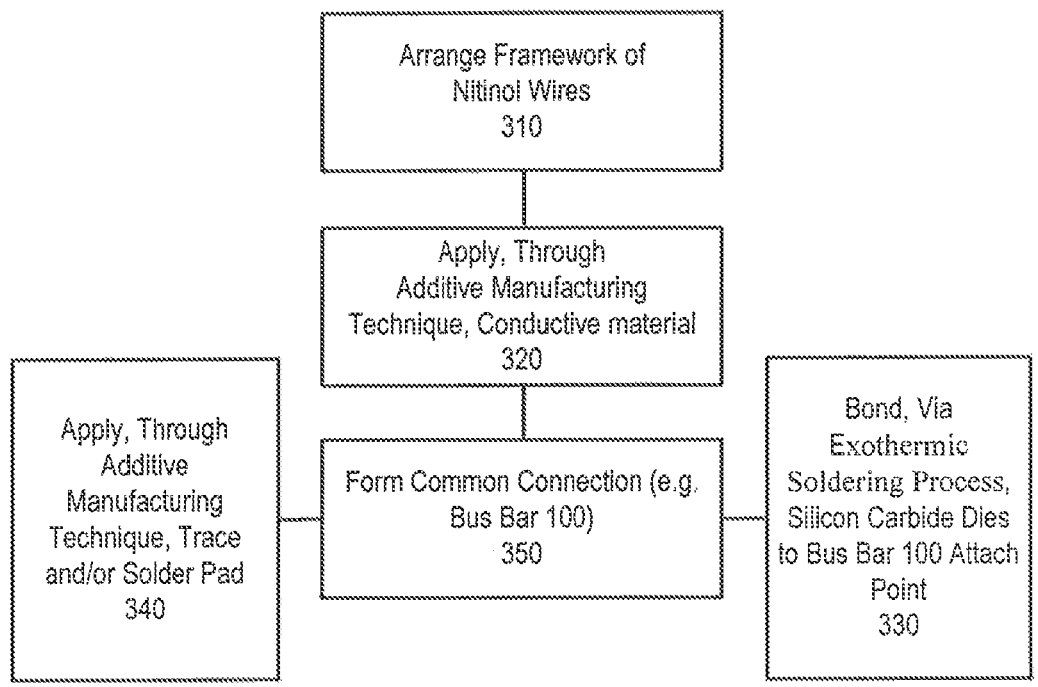
FIG. 3 depicts a representative bus bar formation in accordance with various embodiments.

According to various embodiments and with reference to FIG. 3, a structure of nitinol may be arranged to form a skeleton, e.g. substrate 180, to which an additive manufacturing 101 layer or layers 170 may be added (step 310). For instance, a cold spray of particles 160 may be applied to a mesh like structure of nitinol wire (step 320). The orientation of the framework may be deliberate based on the thermal expansion characteristics of the framework elements. The thickness of this structure may be increased as desired by adding additional layers 170 of both the nitinol wire framework and cold spray material. In response to a suitable quantity of layers being applied, a bus bar 100 may be formed (step 350).

With continued reference to FIG. 3, pads and/or traces may be directly added via an additive manufacturing technique to bus bar 100, such as to a surface of bus bar 100 (step 340). Adding pads and/or traces directly to the bus bar eliminates unnecessary thermal interfaces. Utilizing the techniques and designs described herein also significantly improve the manufacturability as well as the survivability of the product/assembly over the life of the product. According to various embodiments, exothermic material may be used to bond a silicon/silicon carbide dies to bus bar 100 die attach points (step 330).

In accordance with various embodiments, bus bar 100, connection/attach points, and various attributes may also be formed by ultrasonic additive manufacturing where the memory metal is embedded into a metal matrix created by the successive addition of material, such as a metal foil. Thus, in this process, a partial substrate may be formed to which memory metal is embedded into. Additional additive manufacturing layers of any material composition may be added to this structure if desired.

Aluminum, being an isotropic material, will thermally expand substantially equally in all directions. The orientation of the memory metal and/or the memory metal mesh may be designed to exploit contraction in the longitudinal direction (e.g. parallel with the wire or in the direction of the wire). Thus, the effects of thermal expansion on the combination of the two materials may be substantially balanced. A uniform aggregate coefficient of friction is experienced by the bus bar in response to a load being applied.

Figure 4:
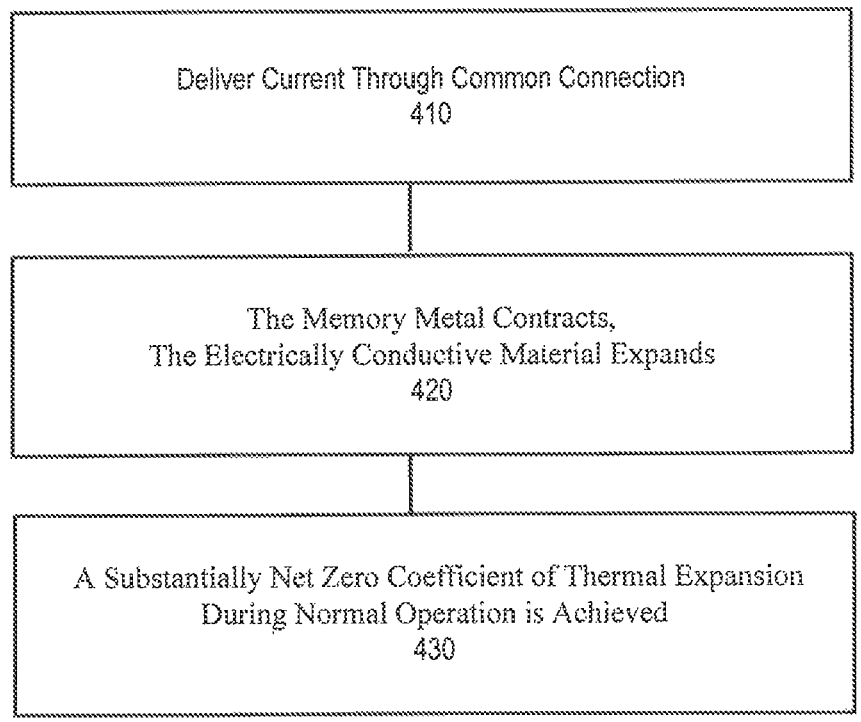
FIG. 4 depicts a representative common connection assembly, such as a bus bar, in operation in accordance with various embodiments.

With continued reference to FIG. 4, in operation (e.g. in response to delivering current through the common connection (bus bar 100)), the nitinol wires contract while the aluminum expands during temperature elevation due to thermal expansion. (step 410, 420). For instance, as the temperature goes up in bus bar 100, by virtue of current running through the bus bar, the nitinol material will experience a phase change and is configured to contract while the aluminum matrix expands. The result is bus bar having reduced thermal expansion, which can be net zero coefficient of thermal expansion (step 430). Stated another way the composition of the memory metal and the electrically conductive material comprise a substantially net zero coefficient of thermal expansion during operation. The volume percent of traditional bus bar material to memory metal may be any volume percent. For instance, the relationship may be about 50 traditional bus bar material to about 50 percent memory metal. According to various embodiments, the relationship may be between about 40-90 percent memory metal to a respective amount of traditional bus bar material.

Though they may span a multitude of applicable applications, the concepts described herein may be utilized in a power distribution system. The system may be configured for and designed to address aircraft power distribution loads. According to various embodiments, the system is configured for driving motors.

The application may be implemented as a distribution panel and/or element of a distribution panel, which is a matrix of multiple function blocks. This results in a configurable, on-demand expandable system. By using separate function blocks, and/or portions of function blocks, each functional block of the matrix may accomplish a one or more functions, and/or deliver current to more than one system. For instance, to satisfy multiple power requirements, various paths of parallel multiples of the function blocks may be aggregated to satisfy a desired power requirement.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." As used herein, the phrases "make contact with", "touch", "interface with" and "engage" may be used interchangeably.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments. Different cross-hatching is used throughout the figures to denote different parts but not necessarily to denote the same or different materials.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A bus bar having a longitudinal axis and comprising:
   a coating having a plurality of memory metal wires configured to contract in response to an increase in temperature that are embedded in the coating to for a memory metal internal framework;
   an electrically conductive material applied to the memory metal internal framework through an additive manufacturing technique and configured to expand in response to the increase in temperature such that the contraction of the wires at least partially offsets the expansion of the electrically conductive material, the memory metal internal framework and the electrically conductive material forming a substrate of the busbar;
   and a solder pad directly added to a surface of the electrically conductive, material via additive manufacturing,
   wherein the plurality of wires are oriented along the longitudinal axis to exploit contraction in the longitudinal direction, and. the composition of the memory metal internal framework and the electrically conductive material comprise a substantially net zero coefficient of thermal expansion in response to current flowing through the bus bar.

2. The bus bar of claim 1, wherein the additive manufacturing technique is at least one of ultrasonic disposition or cold spraying.

3. The bus bar of claim 1, wherein the electrically conductive material includes at least one of brass, nickel, silver, gold, zinc, iron, copper or aluminum.

4. The bus bar of claim 1, wherein the memory metal internal framework includes a nickel-titanium alloy.

5. The bus bar of claim 1, further comprising a conductive trace formed on a surface of the bus bar via additive manufacturing.

6. The bus bar of claim 1, further comprising a silicon carbide die bonded to the solder pad via an exothermic soldering process.

7. The bus bar of claim 1, wherein the additive manufacturing technique includes a ballistic impingement at substantially supersonic velocities to form a layer of coating.

8. The bus bar of claim 1, wherein the bus bar is used in a power distribution system that includes multiple bus bars aggregated as needed to satisfy a desired power requirement.

9. The bus bar of claim 1, further comprising a die bonded to a surface of the electrically conductive material.

10. An electrical distribution system comprising:
a power source input; and a common connection configured to be positioned between a plurality of components and including at least one bus bar having;
a coating having a plurality of memory metal wires configured to contract in response to an increase in temperature that are embedded in the coating to form a memory metal internal framework:
an electrically conductive material applied to the memory metal internal framework through an additive manufacturing, technique and configured to expand in response to the increase in temperature such that the contraction of the wires at least partially offsets the expansion of the electrically conductive material, the memory metal internal framework and the electrically conductive material forming a substrate of the busbar, and
a solder pad directly added to a surface of the electrically conductive material via additive manufacturing,
wherein the plurality of wires are oriented along the longitudinal axis to exploit contraction in the longitudinal direction, and the power source input is electrically coupled to the plurality of components via the common connection.

11. The electrical distribution system of claim 10, wherein the at least one busbar experiences a substantially net zero coefficient of thermal expansion in response to receiving current via the power source input.

12. The electrical distribution system of claim 10, wherein the additive manufacturing technique includes a ballistic impingement at substantially supersonic velocities to form a layer of coating.

13. The electrical distribution system of claim 10, wherein the electrically conductive material includes at least one of brass, nickel, silver, zinc, iron, copper or aluminum.

14. The electrical distribution system of claim 10, wherein the memory metal internal framework includes a nickel-titanium alloy.

15. The electrical distribution system of claim 10, further comprising a conductive trace formed on a surface of the electrically conductive material via an additive manufacturing technique.

16. The electrical distribution system of claim 10, further comprising a silicon carbide die bonded to the solder pad via an exothermic soldering process.

* * * * *

UNITED STATES PATENT AND TRADEMARK OFFICE
CERTIFICATE OF CORRECTION

PATENT NO. : 9,691,515 B2  
APPLICATION NO. : 14/162332  
DATED : June 27, 2017  
INVENTOR(S) : Eric Karlen et al.

Page 1 of 1

It is certified that error appears in the above-identified patent and that said Letters Patent is hereby corrected as shown below:

In the Claims

In Column 6, Line 26, please delete "for" and insert --form--

Signed and Sealed this
Fifth Day of September, 2017

Joseph Matal
*Performing the Functions and Duties of the*
*Under Secretary of Commerce for Intellectual Property and*
*Director of the United States Patent and Trademark Office*